(12) United States Patent
Kim et al.

(10) Patent No.: US 7,151,009 B2
(45) Date of Patent: Dec. 19, 2006

(54) METHOD FOR MANUFACTURING WAFER LEVEL CHIP STACK PACKAGE

(75) Inventors: Soon-Bum Kim, Suwon-si (KR);
Ung-Kwang Kim, Yongin-si (KR);
Kang-Wook Lee, Suwon-si (KR);
Se-Young Jeong, Seoul (KR);
Young-Hee Song, Yongin-si (KR);
Sung-min Sim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 62 days.

(21) Appl. No.: 11/038,210

(22) Filed: Jan. 21, 2005

(65) Prior Publication Data

US 2005/0280160 A1   Dec. 22, 2005

(30) Foreign Application Priority Data

Jun. 18, 2004   (KR) ...................... 10-2004-0045567

(51) Int. Cl.
*H01L 21/44* (2006.01)
*H01L 21/48* (2006.01)

(52) U.S. Cl. ...................................... 438/106; 438/109
(58) Field of Classification Search ............... 438/106, 438/107, 108, 109, 110, 111, 118
See application file for complete search history.

(56) References Cited

U.S. PATENT DOCUMENTS 6,204,091 B1* 3/2001 Smith et al. ................ 438/108

6,340,846 B1* 1/2002 LoBianco et al. .......... 257/783
6,650,019 B1 11/2003 Glenn et al. ................ 257/777
6,939,789 B1* 9/2005 Huang et al. ............... 438/612

FOREIGN PATENT DOCUMENTS

KR   2001-0060223 A   7/2001
KR   2001-0068512 A   7/2001

* cited by examiner

*Primary Examiner*—David Nhu
(74) *Attorney, Agent, or Firm*—Harness, Dickey & Pierce, P.L.C.

(57) ABSTRACT

Provided is a method for manufacturing WLCSP devices that includes preparing at least two wafers, each wafer having a plurality of corresponding semiconductor chips, each semiconductor chip having through electrodes formed in the peripheral surface region, forming or applying a solid adhesive region to a central surface region, stacking a plurality of wafers and attaching corresponding chips provided on adjacent wafers with the solid adhesive region and connecting corresponding through electrodes of adjacent semiconductor chips, dividing the stacked wafers into individual chip stack packages, and injecting a liquid adhesive into a space remaining between adjacent semiconductor chips incorporated in the resulting chip stack package. By reducing the likelihood of void regions between adjacent semiconductor chips, it is expected that a method according to the exemplary embodiments of the present invention exhibit improved mechanical stability and reliability.

20 Claims, 5 Drawing Sheets

METHOD FOR MANUFACTURING WAFER LEVEL CHIP STACK PACKAGE

CROSS REFERENCE TO RELATED APPLICATIONS

This U.S. non-provisional application claims priority under 35 U.S.C. § 119 of Korean Patent Application No. 2004-45567, filed on Jun. 18, 2004, the entire contents of which are incorporated herein by reference.

BACKGROUND OF THE INVENTION

1. Field of the Invention

The present invention relates to a method for manufacturing a wafer level chip stack package.

2. Description of the Related Art

The electronic industry is continually seeking methods, techniques and designs that will result in the manufacture of electronic products that are smaller, lighter, faster, more efficient, operate at higher speeds, provide multiple functions and/or result in improved performance, at an effective cost. One of the methods that has been used for attaining such goals is improved package assembly techniques that have resulted in the development of new types of packages such as chip scale or chip size packages (CSP). The CSPs may be manufactured at chip level or at wafer level, with those manufactured at the wafer level also referred to as wafer level chip scale packages (WLCSP).

Typically, a WLCSP will include a stack of a plurality of semiconductor chips that are interconnected by bump connections. For example, each semiconductor chip may include electrode pads formed on the active surface and through electrodes formed at or along the edges of the semiconductor chip. The through electrodes may, in turn, be connected to the electrode pads by redistribution lines. The corresponding through electrodes provided on adjacent semiconductor chips may then be electrically connected with bump connections. Although the semiconductor chips in the chip stack are physically and electrically connected, the formation of such a stack using only bump bonding tends to result in a space or void being formed between the opposing surfaces of two adjacent semiconductor chips. Such spaces may cause reduced mechanical strength and increase the likelihood of reliability faults in the chip stack package. Therefore, the space between adjacent semiconductor chips should be filled to produce a stronger, more durable chip stack package. In a conventional method for manufacturing a WLCSP, liquid adhesive and/or adhesive tape may be used to fill the space between adjacent semiconductor chips.

FIG. 1 is a cross-sectional view of an example of a conventional WLCSP 130. The WLCSP 130 illustrated in FIG. 1 may be manufactured by sequentially using wafer preparing, wafer stacking, wafer sawing and liquid adhesive injection processes.

A plurality of substantially identical wafers (not shown), each having a plurality of semiconductor chips 111, may be prepared using any conventional semiconductor manufacturing process. Each semiconductor chip 111 is provided with a plurality of through electrodes 113 arranged in a peripheral region of the semiconductor chip and bumps 117 formed on at least one end surface of the through electrodes. Alternatively, instead of forming the bumps 117, the through electrodes 113 may be constructed so as to protrude above a surrounding surface of the semiconductor chip 111 for providing connection between adjacent semiconductor devices.

A plurality of such wafers are then vertically stacked so that the corresponding through electrodes 113 and/or bumps 117 of adjacent semiconductor chips 111 are aligned and brought into contact so as to provide electrical connection between adjacent semiconductor chips. The stacked wafers are then divided into individual chip stack packages 130 and a liquid adhesive 123 may be injected into a space remaining between adjacent semiconductor chips 111 and cured to reduce or eliminate voids from the chip stack package.

The WLCSP in which the spaces between adjacent semiconductor chips has been filled with an adhesive may exhibit improved mechanical strength and reliability in comparison with a similarly constructed WLCSP in which the vacant spaces between the adjacent semiconductor chips have not been filled.

However, because the liquid adhesive 123 used to fill the spaces between the adjacent semiconductor chips 111 typically includes metallic and/or non-metallic particulate filler materials, its flow characteristics may make it difficult to fill the space(s) between adjacent semiconductor chips completely or consistently, particularly for chip stacks having relatively small chip-to-chip spacing. Thus, as illustrated in FIG. 1, a WLCSP 130 manufactured with such a liquid adhesive 123 may still include one or more vacant spaces or voids 135 between adjacent semiconductor chips 111. One proposal for addressing the problem of voids in a WLCSP is to use an adhesive tape rather than a liquid adhesive.

FIG. 2 is a cross-sectional view of another example of a conventional WLCSP 230. The WLCSP 230 illustrated in FIG. 2 may be manufactured by sequentially using wafer preparing, adhesive tape attaching, wafer stacking and wafer sawing processes.

A plurality of substantially identical wafers (not shown), each having a plurality of semiconductor chips 211, each having a plurality of semiconductor chips 111, may be prepared using any conventional semiconductor manufacturing process. Each semiconductor chip 211 will typically include a plurality of through electrodes 213 arranged in a peripheral region of the semiconductor chip. The through electrodes 213 may be constructed with protruding portions (not shown) that extend above the adjacent surface of the semiconductor chip or may be provided with bumps 217 formed on at least on surface of the through electrodes.

An adhesive tape 221 may then be attached to the semiconductor chip 211 while still at the wafer level, the adhesive tape 221 typically having openings provided therein to avoid interfering with the bumps 217 or protruding portions (not shown) by maintaining some minimum separation distance between the adhesive tape and the connecting structures.

A plurality of such wafers are then vertically stacked so that the corresponding through electrodes 213 and bumps 217 of adjacent semiconductor chips 211 are aligned and brought into contact so as to provide electrical connection between adjacent semiconductor chips. The stacked and connected wafers may then be divided into individual chip stack packages 230.

A WLCSP manufactured using an adhesive tape may exhibit improved filling performance and mechanical strength in comparison with a WLCSP manufactured with a liquid adhesive. However, the adhesive tape may result in uneven pressure being applied to one or more of the semiconductor chips during a chip stacking process that may result in warpage of one or more of the semiconductor chips. Further, as illustrated in FIG. 2, during the assembly process, the temperature and/or pressures applied to the chip stack may be sufficient to cause the adhesive tape composition 224 to liquefy and flow out from between the adjacent semiconductor chips and onto the lateral or side surface(s) of the package.

SUMMARY OF THE INVENTION

An exemplary embodiment of the present invention is directed to a method for manufacturing a WLCSP which may improve the mechanical strength and reliability of the resulting package.

The method in accordance with an exemplary embodiment of the present invention may include providing a wafer having a plurality of semiconductor chips having through electrodes, attaching a solid adhesive means to each of the semiconductor chips, stacking a plurality of wafers by bump-bonding corresponding through electrodes of adjacent semiconductor chips and attaching the semiconductor chips by the solid adhesive means, sawing the stacked wafers into individual chip stack packages and injecting a liquid adhesive means into a space between the semiconductor chips.

The solid adhesive means may include an adhesive tape having a base film and adhesive layers formed on both sides of the base film and the separation distance between adjacent semiconductor chips may be between 10 µm and 50 µm.

The operation of stacking a plurality of wafers may include mounting the stacked wafers on a substrate and the solid adhesive means may be formed on an interior region of the semiconductor chip surface and be positioned within and spaced from the peripheral region on which the bumps are provided.

BRIEF DESCRIPTION OF THE DRAWINGS

Exemplary embodiments of the present invention will be readily understood with reference to the detailed description provided below when read in conjunction with the accompanying drawings in which similar or identical reference numerals are used to designate similar or corresponding structural elements, and in which.

These drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or precise positioning of the corresponding structural elements that could be encompassed by an actual device manufactured according to the exemplary embodiments of the invention.

DETAILED DESCRIPTION OF THE EXEMPLARY EMBODIMENTS

The present invention will now be described more fully hereinafter with reference to the accompanying drawings, in which exemplary embodiments of the invention are illustrated. In light of this detailed description, those of ordinary skill in the art will appreciate that this invention may be embodied in many different forms and should not, therefore, be construed as limited to the particular exemplary embodiments set forth herein. Rather, these exemplary embodiments are provided so that this disclosure will be thorough and complete, and will fully convey the scope of the invention to those skilled in the art.

In the description, well-known structures and conventional processes have not been described or illustrated in detail to avoid obscuring the present invention. It will be appreciated that for simplicity and clarity of illustration, some elements illustrated in the figures have not necessarily been drawn to scale. For example, the dimensions of some of the elements have been exaggerated or reduced relative to other elements for clarity.

FIGS. 3A–3F are cross-sectional views of a method for manufacturing a WLCSP in accordance with an exemplary embodiment of the present invention. As illustrated in FIGS. 3A–3F, the disclosed method for manufacturing a WLCSP includes the steps of providing a plurality of wafers, applying a solid adhesive to at least one of the wafers, stacking the wafers so that the solid adhesive is positioned between two adjacent wafers, sawing the stacked wafers to separate semiconductor chip stacks and applying a liquid adhesive to the semiconductor chip stacks.

Figure 1:
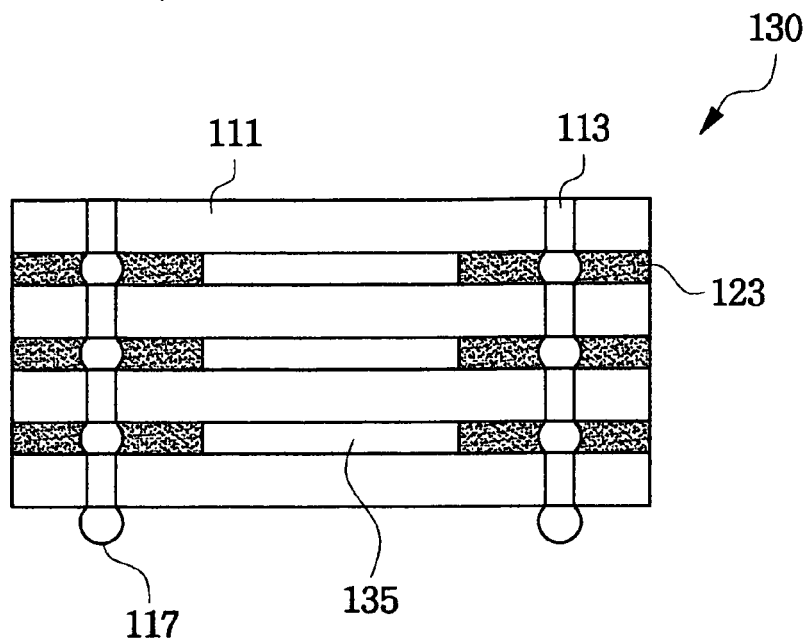
FIG. 1 is a cross-sectional view of an example of a conventional WLCSP.
Figure 2:
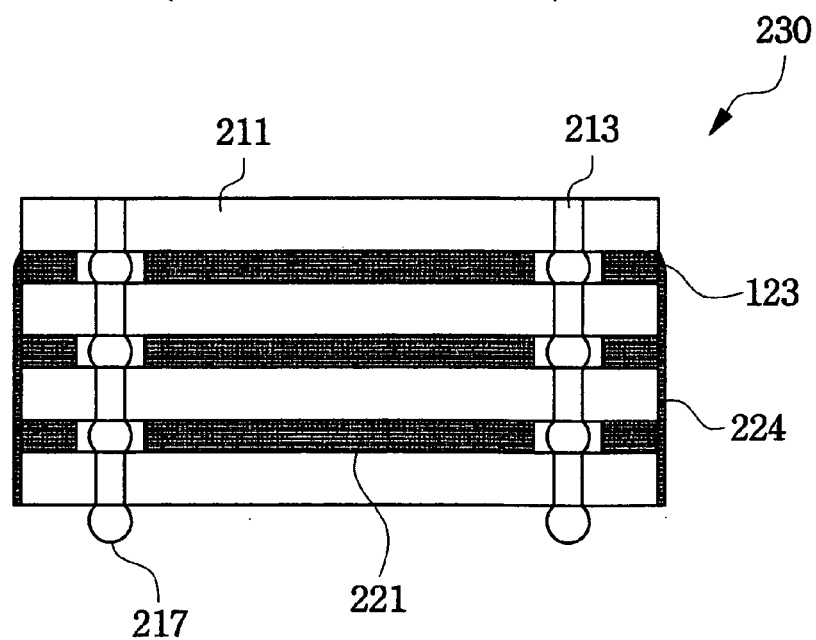
FIG. 2 is a cross-sectional view of another example of a conventional WLCSP.
Figure 3A:
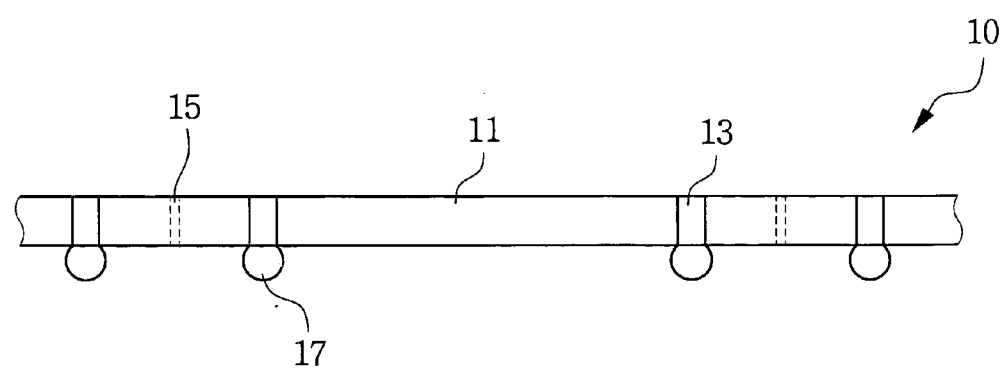
FIG. 3A through FIG. 3F are cross-sectional views of a method for manufacturing a WLCSP in accordance with an exemplary embodiment of the present invention.

As illustrated in FIG. 3A, a wafer 10 may be prepared using any appropriate semiconductor device manufacturing process. The prepared wafer 10 will include a plurality of semiconductor chips 11, with each semiconductor chip including a plurality of through electrodes 13 formed through a peripheral region of the semiconductor chip. Conductive bumps 17 may then be formed on and electrically connected to at least one end of the through electrodes 13. The through electrodes 13 may, in turn, be electrially connected to integrated circuits provided on an interior region of the semiconductor chips 11 by conductive redistribution patterns (not shown). Alternatively, the through electrodes 13 may constructed so as to include a protruding portion that extends above the surrounding surface of the semiconductor chip 11 and eliminate the need to form bumps. The conductive bumps 17 may include solder, nickel, gold, copper, metal alloys or other materials having suitable electrical conductivity and are capable of forming conductive bonds with the material(s) used to form the through electrodes, i.e., good bondability.

Figure 3B:
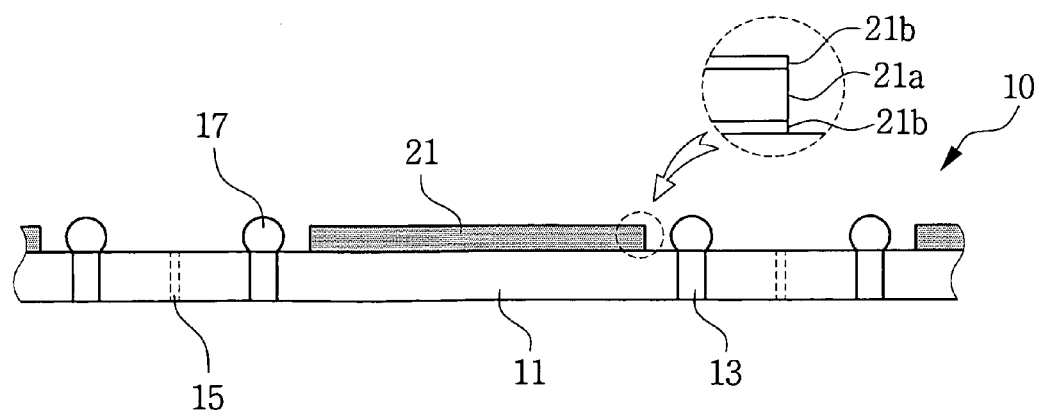

As illustrated in FIG. 3B, a solid adhesive 21, for example an adhesive tape or sheet, is attached to or formed on a portion of a surface of the semiconductor chips 11 formed on the wafer 10. The solid adhesive 21 may be formed on an interior region of a surface of the semiconductor chip 11 and be located completely within the peripheral surface region through which the through electrodes 13 are formed and on which the bumps 17 may be attached. The solid adhesive 21 will typically be sized and configured so as to maintain a minimum spacing between the solid adhesive and any protruding portions of the through electrodes 13 or bumps 17 and so that the solid adhesive defines the perimeter of the space or void in which the through electrodes or bumps are positioned. The space or void will also have at least one open side adjacent a side or lateral surface of the semiconductor chips to allow for the subsequent introduction of a flowable adhesive composition.

The solid adhesive 21 used in this exemplary embodiment may be a multi-layer adhesive tape that includes an intermediate base film 21a with adhesive layers 21b provided on both sides of the base film to provide the desired strength and adhesive performance. It will be appreciated that other solid adhesive materials, such as a single layer tape or an alternate multi-layer adhesive tape having other or different layers to provide particular performance modifications, may be used. It will also be appreciated that the solid adhesive may be formed in place by printing or otherwise depositing an adhesive composition on designated portions of the surface of the semiconductor chips 11 and is not, therefore, limited to any particular construction of or method of forming the solid adhesive 21.

Figure 3C:
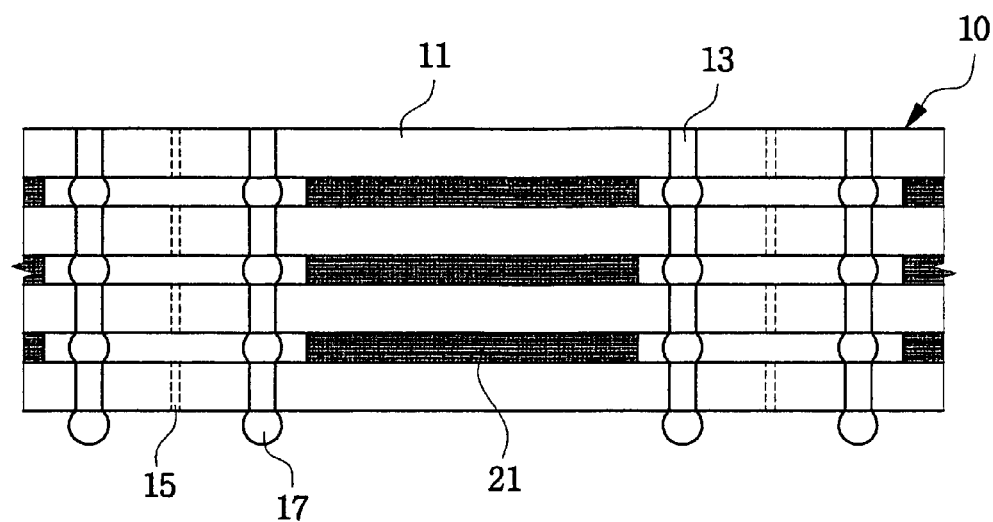

As illustrated in FIG. 3C, after the solid adhesive has been provided on the wafer surface, a plurality of wafers can then be aligned and vertically stacked to interconnect corresponding semiconductor chips 11 on adjacent wafers by connecting corresponding electrodes 13 and/or bumps 17 to provide both mechanical and electrical connections between the adjacent semiconductor chips. The adjacent semiconductor chips 11 will also be attached by the solid adhesive 21 arranged between the opposing surfaces of the semiconductor chips. The solid adhesive 21 may also provide some resilience that will allow for absorption or dampening of at least some of the physical or mechanical shocks to which the semiconductor chip 11 may be subjected during manufacture including, for example, forces applied during the wafer stacking process.

Figure 3D:
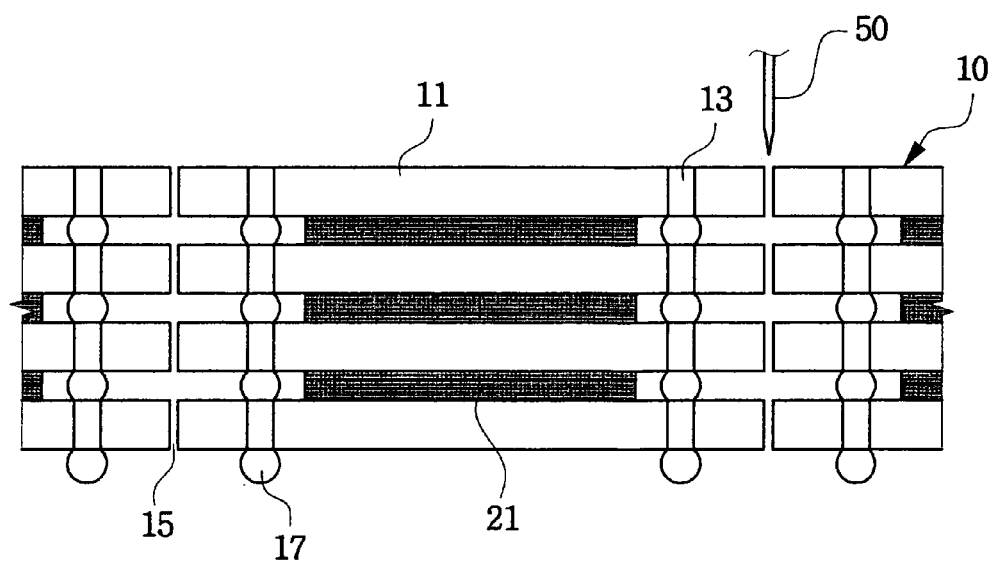

As illustrated in FIG. 3D, after the stacking operation, the stacked wafers 10 may be divided into individual chip stack packages including a plurality of vertically stacked semiconductor devices 11. The wafers 10 may, for example, be separated along scribe lines 15 using a high-speed rotary diamond blade 50, a laser beam scribing apparatus or any other suitable means for removing or weakening those portions of the wafers that lie between adjacent semiconductor chips so that the chip stack packages may be separated.

Figure 3E:
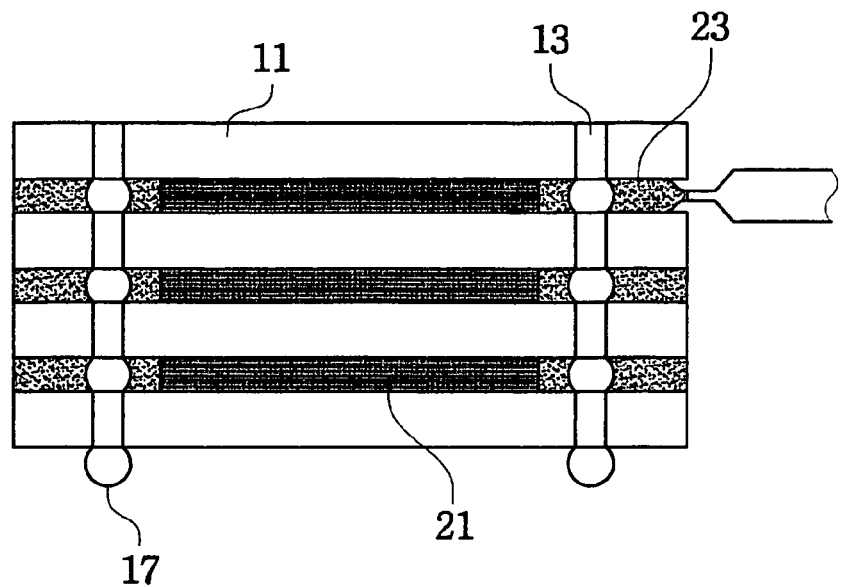

As illustrated in FIG. 3E, a flowable adhesive composition 23 may then be injected into the spaces remaining between the adjacent semiconductor chips 11. For example, the flowable adhesive composition 23 may be a liquid adhesive that is applied sequentially or simultaneously into the portions of the space between the semiconductor chips 11 that are exposed along the lateral or side surfaces of the semiconductor chips. When using a liquid adhesive, the flowable adhesive composition 23 may be injected into or otherwise inserted or deposited into the space. The flowable adhesive composition will typically flow into the space or void from the lateral edge of the semiconductor chip to the exterior portion of the solid adhesive 21 at least partially as the result of capillary action and, in so doing, will surround and encapsulate those portions of the through electrodes 13 and/or bumps 17 that are present within the space. The flowable adhesive composition 23 may include liquid adhesive such as an epoxy resin adhesive, an adhesive suspension or a fine powder.

Figure 3F:
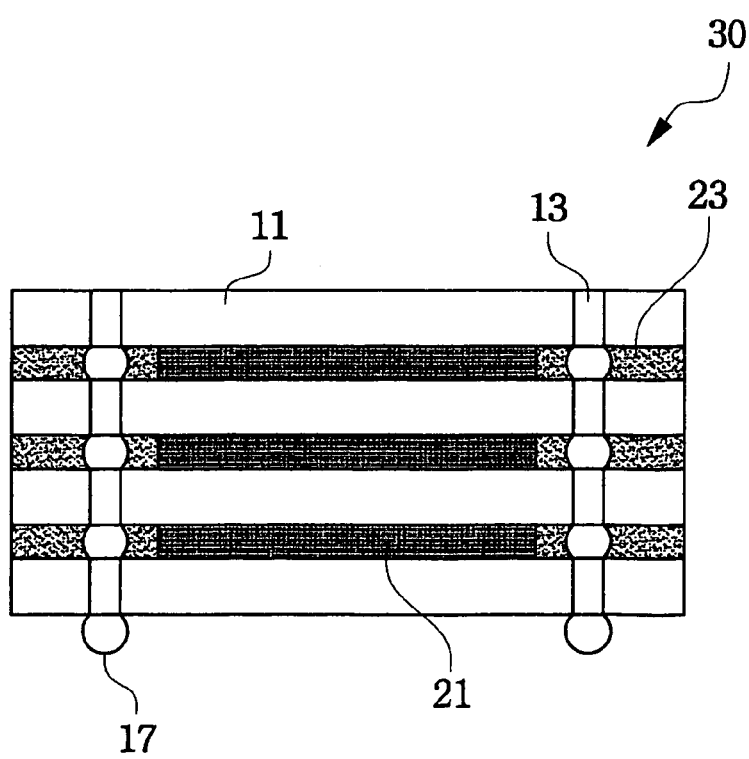

After application, the flowable adhesive composition 23 may be cured by any appropriate method including, for example, self-curing, heating or UV irradiation. The exemplary embodiment of the manufacturing method described above may produce a completed WLCSP 30 as illustrated in FIG. 3F.

Manufacturing a WLCSP using a method in accordance with the exemplary embodiment of the method described above will tend to increase the extent to which the space formed between adjacent semiconductor chips may be filled by using a combination of a solid adhesive and a flowable adhesive composition. By locating the solid adhesive on a more central portion of the surface of the semiconductor chip, both the space that the later-applied flowable adhesive composition will be filling and the strength requirements for the cured flowable adhesive composition may be reduced. Similarly, because the flowable adhesive composition will no longer need to flow to the center of the semiconductor chip, the flow channel length will be reduced accordingly. If, for example, the distance between adjacent semiconductor chips is 30 μm or less, a range of conventional liquid adhesive compositions may be used for filling the space. It is expected that in most instances the distance between adjacent semiconductor chips is will be between about 10 μm and 50 μm.

Figure 4:
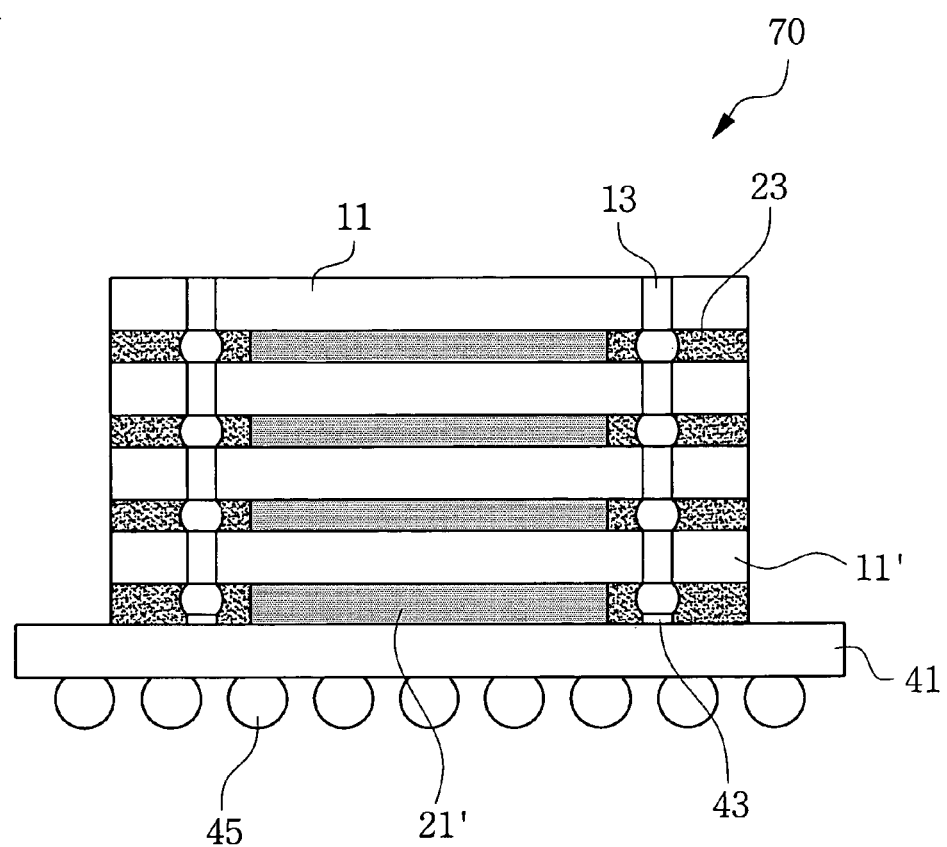
FIG. 4 is a cross-sectional view of a method for manufacturing a WLCSP in accordance with another exemplary embodiment of the present invention.

FIG. 4 is a cross-sectional view of a method for manufacturing a WLCSP in accordance with another exemplary embodiment of the present invention. As illustrated in FIG. 4, the method for manufacturing a WLCSP may further comprise mounting the lowermost semiconductor chip 11' of a WLCSP such as that illustrated in FIG. 3F on a substrate 41 or, alternatively, attaching a substrate 41 to a WLCSP. As illustrated in FIG. 4, in semiconductor chip 11' the through electrodes 13 may be bump-bonded to corresponding substrate pads 43. The semiconductor chip 11' may be attached to the substrate 41 using a solid adhesive 21', which may be, but is not necessarily, the same solid adhesive 21 that is used to attach adjacent semiconductor chips 11, 11' within the chip stack and may, as noted above, be a single-layer or multi-layer adhesive tape.

Connecting bumps 45 may be provided on a surface of the substrate separated from the chip stack, typically on a surface of the substrate opposite the surface to which the chip stack is attached, for allowing connection of the stacked semiconductor chips 11, 11' to external devices or circuits and thereby complete formation of the WLCSP 70. The bumps 45 may be formed on or applied to the substrate 41 before or after the chip stack has been attached to the substrate and may be provided in conventional or custom arrangements for subsequent connection to another substrate or device (not shown).

Accordingly, a method for manufacturing a WLCSP in accordance with an exemplary embodiment of the present invention may improve physical or mechanical stability and reliability during a chip stacking process at wafer level or chip level. The sufficiency of the bump connections may be inspected or otherwise tested after the chip stacking process to confirm that the connection process was at least nominally successful. Sample devices may be subjected to additional destructive and/or accelerated life testing for evaluating the yield and stability of the produced WLCSP devices.

Although certain exemplary embodiments of the present invention have been described in detail above, it should be understood that many variations and/or modifications of the basic inventive concepts herein taught, which may appear to those skilled in the art, will still fall within the spirit and scope of the exemplary embodiments of the present invention as defined in the appended claims. For example, the present invention may be employed in manufacturing a chip stack package having a stack structure that utilizes a flip chip bonding process at the chip level. Further, the present invention may be incorporated in the manufacture of semiconductor devices having a space between wafers, between semiconductor chips, and/or between a single semiconductor chip or a chip stack and a substrate.

What is claimed is:

1. A method for manufacturing a wafer level chip scale package (WLCSP) comprising:
   preparing a first wafer having a plurality of first semiconductor chips, wherein each first semiconductor chip includes a plurality of first conductive connectors formed in a peripheral region;
   preparing a second wafer having a plurality of second semiconductor chips, wherein each second semiconductor chip includes a plurality of second conductive connectors formed in a peripheral region;

forming a solid adhesive region on the first semiconductor chips, the solid adhesive region covering at least a central portion of the first semiconductor chips;

stacking the first wafer and the second wafer whereby the first semiconductor chips are aligned with corresponding second semiconductor chips and are attached by the solid adhesive regions, and whereby the first conductive connectors form electrical connections to corresponding second conductive connectors;

separating the first and second stacked wafers into a plurality of chip stack packages having at least a first void formed between opposing surfaces of the first and second semiconductor chips, the first void being open to a lateral surface; and filling the first void with a flowable adhesive composition.

2. A method for manufacturing a wafer level chip scale package (WLCSP) according to claim 1, further comprising:
curing the flowable adhesive composition.

3. A method for manufacturing a wafer level chip scale package (WLCSP) according to claim 1, wherein:
the first and second conductive connectors are through electrodes, the through electrodes having a conductive protrusion formed on at least one end.

4. A method for manufacturing a wafer level chip scale package (WLCSP) according to claim 3, wherein:
the conductive protrusions are conductive bumps formed on at least one end of the through electrodes.

5. A method for manufacturing a wafer level chip scale package (WLCSP) according to claim 1, wherein:
the solid adhesive region is a multi-layer adhesive tape.

6. A method for manufacturing a wafer level chip scale package (WLCSP) according to claim 5, wherein:
the multi-layer adhesive tape includes a core layer between an upper adhesive layer and a lower adhesive layer.

7. A method for manufacturing a wafer level chip scale package (WLCSP) according to claim 1, wherein:
filling the exposed void with a flowable adhesive composition includes injecting a liquid adhesive into the first void.

8. A method for manufacturing a wafer level chip scale package (WLCSP) according to claim 1, wherein:
the solid adhesive region covers at least portions of the peripheral region and
the first conductive connectors are located within the at least one first void.

9. A method for manufacturing a wafer level chip scale package (WLCSP) according to claim 1, wherein:
the solid adhesive is printed onto a surface of the first semiconductor chips.

10. A method for manufacturing a wafer level chip scale package (WLCSP) according to claim 1, wherein:
the solid adhesive region is formed on substantially all of the plurality of first semiconductor chips.

11. A method for manufacturing a wafer level chip scale package (WLCSP) according to claim 2, wherein:
the opposing surfaces of the first semiconductor chip and the second semiconductor chip are separated by a distance of between about 10 μm and about 50 μm.

12. A method for manufacturing a wafer level chip scale package (WLCSP) according to claim 1, wherein:
filling the first void with a flowable adhesive composition includes injecting a particulate adhesive into the first void.

13. A method for manufacturing a wafer level chip scale package (WLCSP) according to claim 1, wherein:
filling the first void with a flowable adhesive composition includes injecting an adhesive dispersion into the first void.

14. A method for manufacturing a wafer level chip scale package (WLCSP) comprising:
preparing a first wafer having a plurality of first semiconductor chips, wherein each first semiconductor chip includes a plurality of first conductive connectors formed in a peripheral region;

preparing a second wafer having a plurality of second semiconductor chips, wherein each second semiconductor chip includes a plurality of second conductive connectors formed in a peripheral region;

forming a first solid adhesive region on the first semiconductor chips, the first solid adhesive region covering at least a central portion of the first semiconductor chips;

stacking the first wafer and the second wafer whereby first semiconductor chips are aligned with corresponding second semiconductor chips and are attached by the first solid adhesive region, and whereby the first conductive connectors form electrical connections to corresponding second conductive connectors;

separating the first and second stacked wafers into a plurality of chip stacks having at least a first void formed between opposing surfaces of the first and second semiconductor chips, the first void being open at a lateral surface;

preparing a substrate having a plurality of substrate pads;

attaching at least one of the plurality of chip stacks to the substrate using a second solid adhesive region whereby first conductive connectors are aligned with and form electrical connections to corresponding substrate pads and whereby at least a second void is formed between opposing surfaces of the first semiconductor chip and the substrate; and filling the at least first and second voids with a flowable adhesive composition to complete the WLCSP.

15. A method for manufacturing a wafer level chip scale package (WLCSP) according to claim 14, further comprising:
curing the flowable adhesive composition.

16. A method for manufacturing a wafer level chip scale package (WLCSP) according to claim 14, wherein:
the first and second conductive connectors are through electrodes, the through electrodes having a conductive protrusion formed on at least one end.

17. A method for manufacturing a wafer level chip scale package (WLCSP) according to claim 16, wherein:
the conductive protrusions are conductive bumps formed on at least one end of the through electrodes.

18. A method for manufacturing a wafer level chip scale package (WLCSP) according to claim 14, wherein:
the first and second solid adhesive regions are multi-layer adhesive tape.

19. A method for manufacturing a wafer level chip scale package (WLCSP) according to claim 18, wherein:
the multi-layer adhesive tape includes a core layer between an upper adhesive layer and a lower adhesive layer.

20. A method for manufacturing a wafer level chip scale package (WLCSP) according to claim 14, wherein:
filling the first and second voids with a flowable adhesive composition includes injecting a liquid adhesive into the first and second voids.

* * * * *